United States Patent
Ueda et al.

[11] Patent Number: 6,008,088
[45] Date of Patent: Dec. 28, 1999

[54] METHOD FOR FABRICATING A SEMICONDUCTOR MEMORY DEVICE

[75] Inventors: Kenji Ueda, Osaka; Kyoko Egashira, Kyoto, both of Japan

[73] Assignee: Matsushita Electric Industrial Co., Ltd., Osaka, Japan

[21] Appl. No.: 09/099,615

[22] Filed: Jun. 18, 1998

[30] Foreign Application Priority Data

Jun. 24, 1997 [JP] Japan ................................ 9-166990

[51] Int. Cl.⁶ .................................................. H01L 21/336
[52] U.S. Cl. ............................ 438/257; 438/266; 438/264
[58] Field of Search ........................................ 438/218, 221, 438/222, 245, 257, 258, 259, 264, 266, 267, 276, 424, 429, 430; 257/316

[56] References Cited

U.S. PATENT DOCUMENTS

| | | | |
|---|---|---|---|
| 3,984,822 | 10/1976 | Simko et al. | 438/257 |
| 4,300,279 | 11/1981 | Wieder | 438/257 |
| 4,698,900 | 10/1987 | Esquivel | 437/52 |
| 5,070,032 | 12/1991 | Yuan et al. | 437/43 |
| 5,229,312 | 7/1993 | Mukherjee et al. | 438/259 |
| 5,231,299 | 7/1993 | Ning et al. | 257/316 |
| 5,712,179 | 1/1998 | Yuan | 438/267 |
| 5,753,951 | 5/1998 | Geissler | 257/316 |
| 5,756,385 | 5/1998 | Yuan et al. | 438/258 |
| 5,838,039 | 11/1998 | Sato et al. | 438/264 |
| 5,851,881 | 12/1998 | Lin et al. | 438/266 |
| 5,854,114 | 12/1998 | Li et al. | 438/257 |
| 5,879,983 | 3/1999 | Segawa et al. | 438/257 |

FOREIGN PATENT DOCUMENTS 4-340767  11/1992  Japan .

*Primary Examiner*—Charles Bowers
*Assistant Examiner*—Jack Chen
*Attorney, Agent, or Firm*—Pearne, Gordon, McCoy & Granger LLP

[57] ABSTRACT

A method for fabricating a semiconductor memory device such as an EEPROM including, in a semiconductor substrate having a first conductivity type, forming a source region and a drain region having a second conductivity type opposite to the first conductivity type. A trench having a prescribed thickness from a main surface of said semiconductor substrate toward inside thereof is formed in an area to be an element isolation region of the semiconductor substrate. A remaining portion of the semiconductor substrate defines an element forming region. Embedding an element isolation insulating film in the trench to substantially fill the trench. A first insulating film is formed on the element forming region and on at least a portion of the element isolation insulating film. A floating gate electrode is formed on the first insulating film, a second insulating film is formed on the floating gate electrode, a control gate electrode is formed on the second insulating film, a third insulating film to be a tunneling medium is formed on a side of the floating gate electrode, and an erasing gate electrode is formed so as to cover said third insulating film.

9 Claims, 8 Drawing Sheets

METHOD FOR FABRICATING A SEMICONDUCTOR MEMORY DEVICE

BACKGROUND OF THE INVENTION

1. Field of the Invention

The present invention relates to a semiconductor memory device and more particularly, to a floating gate type EEPROM (Electrically Erasable and Programmable Read Only Memory) equipped with an erasing gate electrode and a method for fabricating the same.

2. Description of the Related Art

In recent years, a floating gate type EEPROM, as a nonvolatile semiconductor memory device capable of holding written information with no power supply, has been used for an internal and external memory device for a variety of computers.

Now, several kinds of structures of the floating gate type EEPROM are proposed. One of them is a structure in which an erasing gate electrode is provided in the vicinity of a floating gate (for example, see JP-A-4-340767). FIGS. 13A and 13B to FIGS. 18A and 18B and 18c are sequential step sectional views, in each of which figure A shows a section taken in line B–B' of figure B, and figure B shows a section taken in line A–A' in figure A. Incidentally, FIG. 18C is a view showing an peripheral region adjacent to the structure shown in FIG. 18B. In FIG. 18C, reference numeral 32S denotes an electric wiring pattern of a peripheral circuit formed in the same step as the erasing gate electrode 32.

First, as seen from FIGS. 13A and 13B, the one main surface of a P-type silicon (Si) 21 is selectively subjected to ion implantation to form N-type diffusion layers 22a and 22b. These N-type diffusion layers serve as a source and a drain of a memory cell, respectively.

As seen from FIGS. 14A and 14B, by a known CVD technique, a silicon oxide film 23 for element isolation is formed on the P-type Si substrate 21. By selective dry etching using a photoresist, a prescribed area of the silicon oxide film 23 is removed selectively. Subsequently, by the known CVD technique, another silicon oxide film is formed on the entire surface. Thereafter, by anisotropic dry etching, a side wall film 24 made of silicon oxide is formed on the side wall of the silicon oxide film 23.

As seen from FIGS. 15A and 15B, by a thermal oxidation technique, a silicon oxide film 25 serving as a gate oxide film is formed on the exposed area of the P-type Si substrate 21. Thereafter, by the known CVD technique, a polycrystalline silicon (poly-Si) film 26 is formed on the entire surface. Using the selective dry etching using photoresist, with a prescribed area of the poly-Si film 26 left, the remaining area is removed. This poly-Si film 26 serves as a floating gate electrode.

As seen from FIGS. 16A and 16B, by the thermal oxidation technique, a silicon oxide film 27 is formed on the entire surface. By the known CVD technique, a poly-Si film 28 is formed thereon. Thereafter, by the known CVD technique, a silicon oxide film 29 is formed, and further, using the selective dry etching using photoresist as a mask, with a prescribed area of the silicon-oxide film 29 left, the remaining area is removed. Subsequently, using as a mask the silicon oxide film 29, a prescribed area of the poly-Si film 28 and the silicon oxide film 27 is selectively removed subsequently. The poly-Si film 28 serves as a control gate electrode.

As seen from FIGS. 17A and 17B, by the known CVD technique, a silicon oxide film 30 is formed on the entire surface. Subsequently, by the anisotropic dry etching, a side wall film made of the silicon oxide film 30 is formed on the side wall of the silicon oxide film 29 and poly-silicon film 28. Thereafter, using as a mask the silicon oxide films 29 and 30, with a prescribed area of the underlying poly-Si film 26 being left, its remaining unnecessary portion is removed.

As seen from FIGS. 18A–18c, by the thermal oxidation technique, a silicon oxide film 31 serving as a tunnel film is formed on the exposed area of the side of the poly-Si film 26. Subsequently, by the known CVD technique, a poly-Si film 32 is formed. Further, by the selective dry etching technique using photoresist, with a prescribed pattern of the poly-Si film 32 being left, its remaining area is removed to form an erasing gate electrode made of the poly-Si film 32.

Further, metallic wirings (not shown) will be made for the N-type diffusion layers 22a and 22b serving as a source and a drain, the poly-Si film 28 serving as a control gate electrode and poly-Si film 32 serving as an erasing gate electrode.

An explanation will be given of the operation of the semiconductor memory device thus fabricated.

In a write operation, a voltage of 12 V is applied to the poly-Si film 28 serving as a control gate electrode, and the P-type Si substrate 21 and the N-type diffusion layer 22a serving as a source region are grounded. Simultaneously, a voltage pulse signal having a height of 10 V and width of $10 \times 10^{-6}$ sec is applied to the N-type diffusion layer 22b serving as a drain region. Then, hot electrons are generated in the vicinity of the boundary between the N-type diffusion layer 22b and the P-type Si substrate 21. Part of them is pulled by the potential of the poly-Si film 26 which has been enhanced due to coupling so that they are injected into the poly-Si film 26 through the silicon oxide film 25. They remain stored in the poly-Si film 26 serving as a floating gate even after completion of application of the voltage pulses. Thus, the write operation is completed.

In an erase operation, with the poly-Si film 28 serving as the control gate electrode, P-type Si substrate 21, N-type diffusion layer 22a serving as the source region and N-type diffusion layer 22b being grounded, voltage pulses having a height of 15 V and width of $1 \times 10^{-3}$ sec are applied to the poly-Si film 32 serving as the erasing gate electrode. During the application of the voltage pulses, the electrons which have been stored in the poly-Si film 26 serving as the floating gate electrode move to the poly-Si film 32 through the silicon oxide film 31. The electrons in the poly-Si film 26 are eventually discharged to complete the erasing operation.

In a read operation, with the P-type substrate 21 and N-type diffusion layer 22a serving as the source region being grounded, voltages of 5 V and 1.5 V are applied to the poly-Si film 28 serving as the control gate electrode and the N-type diffusion layer 22b serving as the drain region, respectively. In this state, a current flowing between the N-type diffusion layer serving as the drain region and the N-type diffusion layer 22a serving as the source region is read.

In the floating gate type EEPROM subjected to the write operation, when it serves as a MOS (Metal-Oxide-Silicon) transistor, the threshold voltage is boosted owing to the electrons stored in the floating gate electrode of the poly-Si film 26 so that the current flowing between the N-type diffusion layer 22b serving as the drain region and the N-type diffusion layer 22a serving as the source region becomes several pA or less. On the other hand, in the floating gate type EEPROM subjected to the erase operation, the threshold voltage is lowered as compared with when it is in the written state so that a current of several μA–several tens of μA flows by the above read operation.

Thus, in terms of the current flowing the N-type diffusion layer 22b serving as the drain region and the N-type diffusion layer 22a serving as the source region, the written state and erased state of the floating gate EEPROM can be discriminated from each other.

However, the conventional floating gate type EEPROM having an erasing gate electrode has the following defects. In such an EEPROM, on an element isolation film which is a CVD film formed on the surface of an Si substrate, the floating gate electrode, control gate electrode and erasing electrode are successively stacked. Therefore, when the floating gate electrode, control electrode and erasing gate electrode and erasing gate electrode are formed, a very large level difference occurs between each electrode and the surface of the Si substrate. Particularly, assurance of the depth of focus in lithography of the erasing gate electrode may become difficult, or etching remainder is apt to occur during the dry etching. This makes it difficult to effect micromachining less than submicron.

SUMMARY OF THE INVENTION

An object of the present invention is to solve the above problem in the prior art to provide a floating gate type semiconductor memory device having an erasing gate electrode which provides a small level difference between a floating gate electrode, control gate electrode and erasing gate electrode and the surface of an Si substrate, and can be easily micromachined.

Another object of the present invention is to provide a method for fabricating such a floating gate type semiconductor memory device.

In order to attain the above objects, in accordance with the first aspect of the present invention there is provided a semiconductor device comprising: an element isolation region formed in a semiconductor substrate having a first conductivity type; a source region and a drain region formed in an element forming region surrounded by the element isolation region, the source region and drain region having a second conductivity type opposite to the first conductivity type; a first insulating film formed on the element forming region; a floating gate electrode formed on the first insulating film; a second insulating film formed on the floating gate electrode; a control gate electrode formed on the second insulating film; a third insulating film formed on the floating gate electrode; and an erasing gate electrode formed so as to face to the floating gate electrode through the third insulating film to be a tunneling medium.

In accordance with the same aspect of the present, there is provided a method for fabricating a semiconductor memory device comprising the steps of: in a semiconductor substrate having a first conductivity type, forming a source region and a drain region having a second conductivity opposite to the first conductivity type; forming a trench having a prescribed thickness from a main surface of the semiconductor substrate toward inside thereof in an area to be an element isolation region of the semiconductor substrate; embedding an element isolation insulating film in the trench; forming a first insulating film on an element forming region of the semiconductor substrate isolated by the element isolation insulating film; forming a floating gate electrode on the first insulating film; forming a second insulating film on the floating gate electrode; forming a control gate electrode on the second insulating film; forming a third insulating film to be a tunneling medium on a side of the floating gate electrode; and forming an erasing gate electrode so as to cover the third insulating film.

In accordance with the second aspect of the present invention, there is provided a semiconductor memory device comprising: an insulating film for element isolation formed at a prescribed portion on a semiconductor substrate having a first conductivity type; a semiconductor layer embedded in a portion not covered by the insulating film on the semiconductor substrate; a source region and a drain region formed in the semiconductor layer and having a second conductivity type opposite to the first conductivity type; a first insulating film formed at a prescribed area of the semiconductor layer; a floating gate electrode formed on the first insulating film; a second insulating film formed on the floating gate electrode; a control gate electrode formed on the second insulating film; a third insulating film formed on the floating gate electrode; and an erasing gate electrode formed on the third insulating film so as to face to the floating gate electrode.

In accordance with the same aspect of the present invention, there is a method for fabricating a semiconductor device comprising the steps of: forming a first insulating film on a semiconductor substrate having a first conductivity type; making an opening portion to be an element forming region of the first insulating film; forming a semiconductor layer having a first conductivity type in the opening portion; forming a source region and a drain region in the semiconductor layer, the source region and drain region having a second conductivity type opposite to the first conductivity type; forming a second insulating film at a prescribed portion of the semiconductor substrate; forming a floating gate electrode on the second insulating film; forming a third insulating film on a prescribed portion of said floating gate electrode; forming a control electrode on the third insulating film; forming a fourth insulating film to be a tunneling medium on a side of the floating gate electrode; and forming an erasing gate electrode so as to cover the fourth insulating film.

In accordance with the present invention, in the floating gate type EEPROM equipped with an erasing gate electrode, by embedding the insulating film inside the Si substrate to implement element isolation, a level difference between the Si substrate and the floating gate electrode, control gate electrode, erasing gate electrode can be reduced remarkably. The etching remainder is difficult to occur during the dry etching of each electrode, particularly during etching of the erasing gate electrode. In addition, the depth of focus in lithography can be easily assured when the erasing gate electrode is formed. This makes it very easy to effect micromachining less than submicron as compared with the prior art and fabricating method, and greatly contributes to realize the high integration of the floating gate type semiconductor memory device.

Additionally, since the erasing gate electrode and the wiring pattern in a peripheral circuit are generally formed in the same step, a large level difference occurs therebetween, thus making it impossible to effect the lithography at high precision. On the other hand, in accordance with the present invention, since the element isolation region of the memory area is constructed of the trench formed in the semiconductor substrate, or the element region is arranged in a region surrounded by the element isolation film in the surface of the semiconductor substrate, the erasing gate electrode has a structure lowered by the thickness of element isolation region as compared with the prior art structure. Therefore, the level difference is decreased so that the lithography can be effected at high precision. Thus, a non-volatile memory can be fabricated with high precision and high reliability.

The above and other objects and features of the present invention will be more apparent from the following description of the present invention taken in conjunction with the accompanying drawings.

BRIEF DESCRIPTION OF THE DRAWINGS

FIGS. 1A and 1B to FIGS. 8A, 8B and 8C are sequential step sectional views of a semiconductor memory device for explaining the first embodiment of the present invention.

FIGS. 10A and 10B to FIGS. 12A and 12B are sequential step sectional views of a semiconductor memory device for explaining the second embodiment of the present invention.

FIGS. 13A and 13B to FIGS. 18A, 18B and 18C are sequential step sectional views for explaining one example of a conventional method for fabricating a semiconductor memory device.

DESCRIPTION OF THE PREFERRED EMBODIMENTS

Embodiment 1

FIGS. 1A and 1B to FIGS. 8A, 8B and 8C are sequential step sectional views for explaining the method for fabricating a semiconductor memory device according to the present invention. In each of the figures, figure A shows a section taken in line B–B' of figure B, and figure B shows a section taken in line A–A' in figure A. Incidentally, FIG. 8C is a view showing a peripheral region adjacent to the structure shown in FIG. 8B. Reference symbol 12S denotes an electric wiring pattern of a peripheral circuit formed in the same step as an erasing gate electrode 12.

Figure 1A:
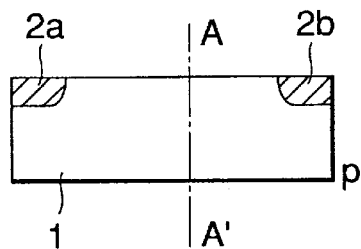
Figure 1B:
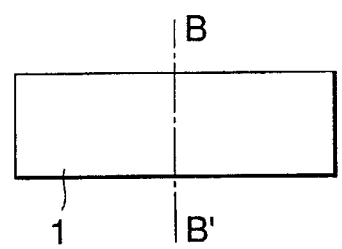

First, as shown in FIGS. 1A and 1B, using photoresist as a mask, As$^+$ ions are selectively implanted under the condition of 40 keV and $1\times10^{15}$ cm$^{-2}$ to form N-type diffusion layers 2a and 2b. The N-type diffusion layers 2a and 2b serve as a source and drain of a memory cell, respectively.

Figure 2A:
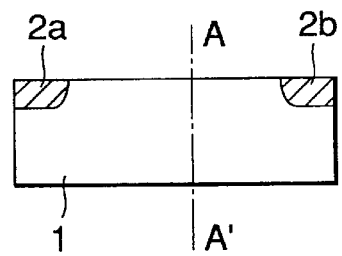
Figure 2B:
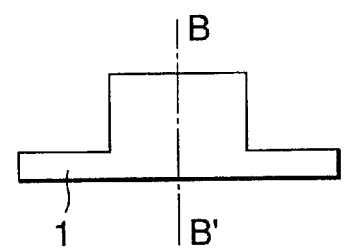

As seen from FIGS. 2A and 2B, an opened portion serving an element isolation region of the P-type Si substrate 1 is made by the selective anisotropic dry etching using a photoresist. In this embodiment, by dry etching under a condition of power of 200 W and pressure of 20 Pa using HBr gas, a trench, which has a depth of about 300 nm from the surface of the P type Si substrate 1 and a width of 0.35 $\mu$m, is formed. Now, in order to realize good embedding, the width of the trench is preferably not larger than 0.35$\mu$ and the depth thereof is preferably not larger than 400 nm. Incidentally, in this case, an N-type diffusion layer serving as a punch-through stopper may be formed on the bottom of the trench.

Figure 3A:
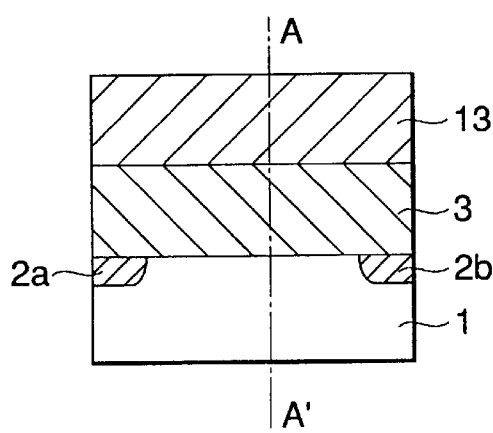
Figure 3B:
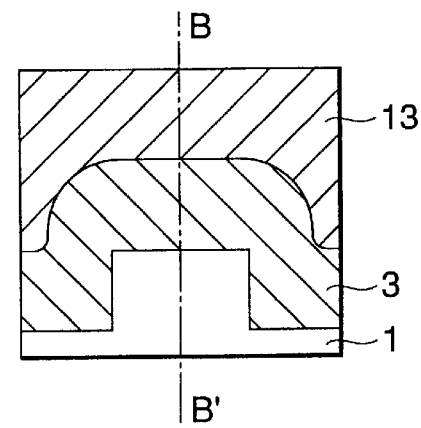

As seen from FIGS. 3A and 3B, on the entire surface of the P-type Si substrate 1, a silicon oxide film 3 having a thickness of about 600 nm is formed by a known CVD technique so that it is embedded in the opened element isolation region. A photoresist 13 is applied on the entire surface to flatten the resultant surface.

Figure 4A:
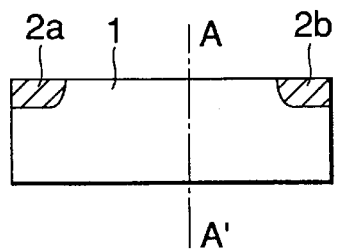
Figure 4B:
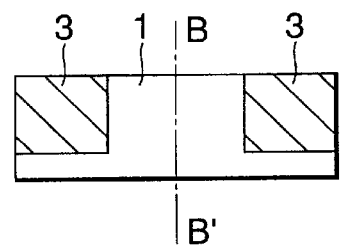

As seen from FIGS. 4A and 4B, by an etch-back technique with the photoresist and silicon oxide film controlled at substantially the same etching rate, etching is done so that the Si substrate 1 is exposed. Thus, the silicon oxide film 3 is embedded in only the opened portion of the P-type Si substrate 1 so as to constitute an element isolation film.

Figure 5A:
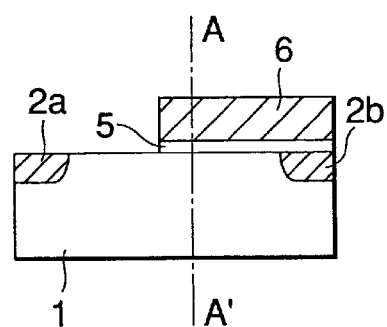
Figure 5B:
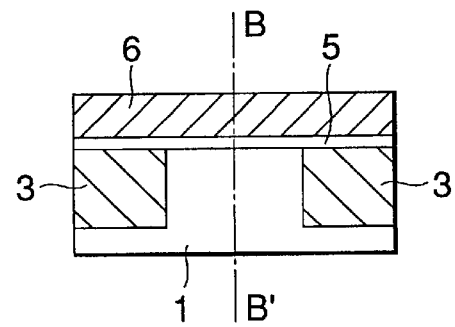

As seen from FIGS. 5A and 5B, by a thermal oxidation technique, the surface of the P-type Si substrate 1 is oxidized to form a silicon oxide film 5 serving as a gate oxide film and having a thickness of about 30 nm. On the silicon oxide film 5, a phosphorus doped poly-Si film 6 having a thickness of 200 nm is formed under temperature of 620° C. or higher. Thereafter, by the selective dry etching technique using a photoresist, with a prescribed portion thereof being left, the remaining portion thereof is etched away.

Figure 6A:
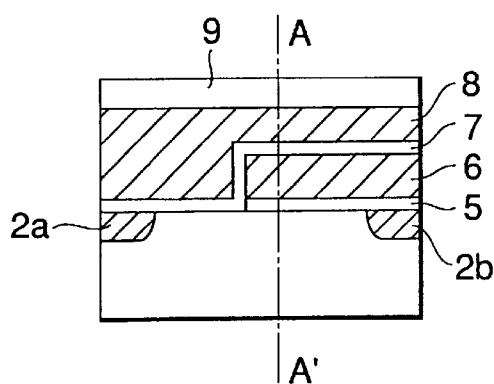
Figure 6B:
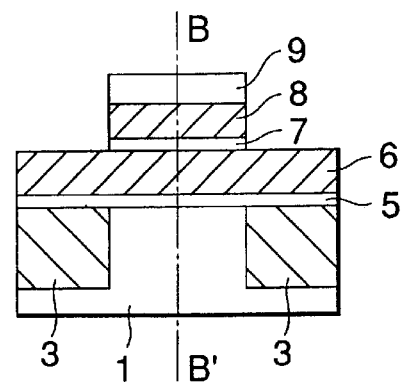

As seen from FIGS. 6A and 6B, by the thermal oxidation, a silicon oxide film 7 having a thickness of about 25 nm is formed on the exposed portion of the P-type Si substrate 1 and on the phosphorus-doped poly-Si film 6. On the silicon oxide film 7, a phosphorus-doped poly-Si film 8 having a thickness of about 200 nm is formed.

Further, by a known CVD technique, on the phosphorus doped poly-Si film 8, a silicon oxide film 9 having a thickness of about 300 nm is formed. By the selective dry etching technique using a photoresist, the silicon oxide film 9 is partially etched away. Thereafter, using the silicon oxide film 9 as a mask, the phosphorus-doped poly-Si film 8 is partially etched in a self-aligned manner. The phosphorus-doped poly-Si film 8 constitutes a control gate electrode. The silicon oxide film 9 serves to electrically insulate the control gate electrode and an erasing gate electrode formed later from each other.

Figure 7A:
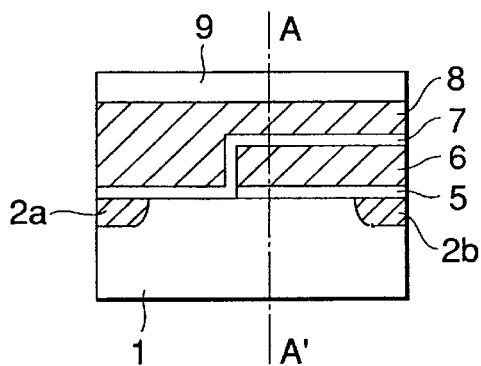
Figure 7B:
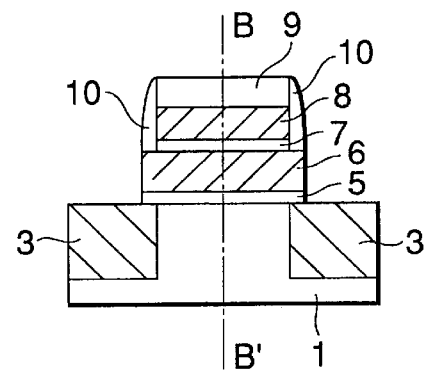

As seen from FIGS. 7A and 7B, by the known CVD technique, a silicon oxide film 10 having a thickness of about 200 nm is formed. By the anisotropic dry etching, the silicon oxide film 10 is etched to form a side wall film having a thickness of about 150 nm, which is made of the silicon oxide film 10, on the side wall of the phosphorus-doped poly-Si film 8 and the silicon oxide film 9. Subsequently, using, as a mask, the silicon oxide films 9 and 10, the underlying phosphorus-doped poly-Si film 6 is etched away in a self-aligned manner. At this time, the phosphorus-doped poly-Si film 6 is electrically disconnected from the outside to constitute a floating gate electrode.

Figure 8A:
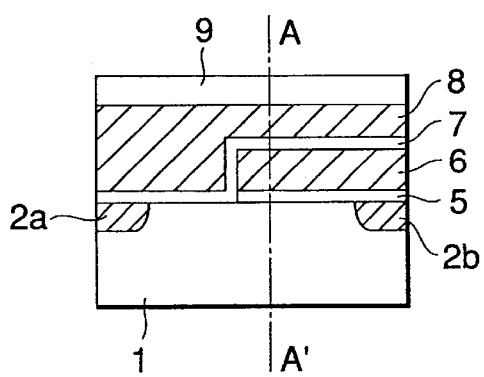
Figure 8B:
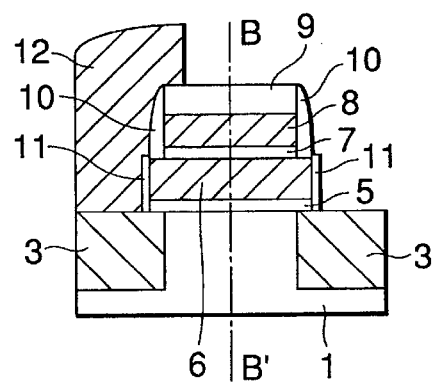
Figure 8C:
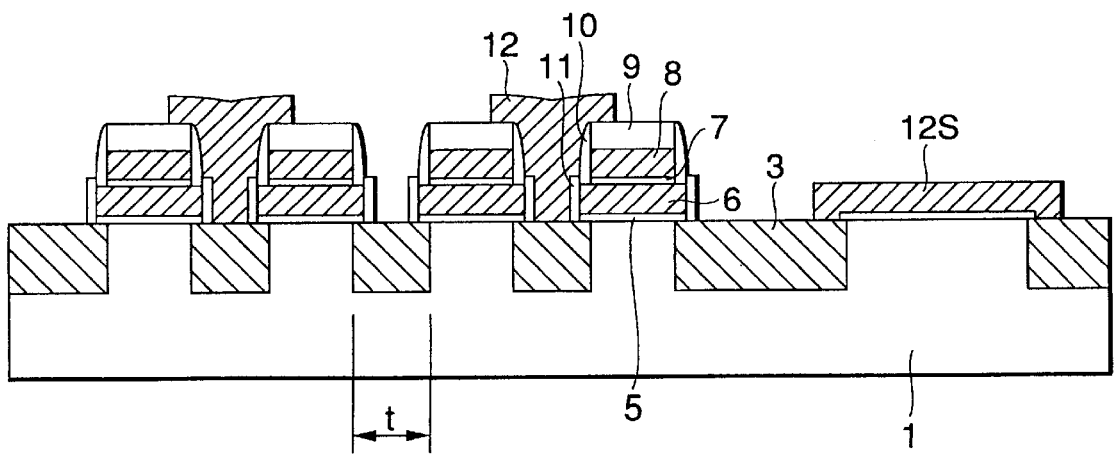

As seen from FIGS. 8A and 8B, the exposed portion of the side wall of the phosphorus-doped poly-Si film 6 is oxidized to form a silicon oxide film 11 having a thickness of about 40 nm. Thereafter, a phosphorus-doped poly-Si film 12 is formed on the entire resultant surface. By the selective dry etching, the phosphorus-doped poly-Si film 12 is partially etched away to form an erasing gate electrode. Thus, a floating gate type EEPROM memory cell equipped with an erasing gate electrode is completed as shown in FIGS. 8A and 8B.

Incidentally, metallic wirings will be made for the N-type diffusion layers 2a and 2b serving as a source and drain; phosphorus-doped poly-Si film 8 serving as a control gate electrode; and phosphorus-doped poly-Si film 12 serving as an erasing gate electrode. This step will not be explained here.

In accordance with this embodiment, since the element isolation film is formed within the P-type Si substrate 1, as compared with the prior art in which the element isolation film is formed on the P-type Si substrate 1, the level difference between the P-type Si substrate 1 and the floating gate electrode, control gate electrode, erasing gate electrode can be reduced remarkably. The etching reminder is not substantially occurred during the dry etching of each electrode. In addition, the depth of focus in lithography can be easily assured. This makes it possible to effect micromachining less than submicron, as compared with the prior art structure equipped with the element isolation film of a CVD film on the Si substrate.

Figure 18A:
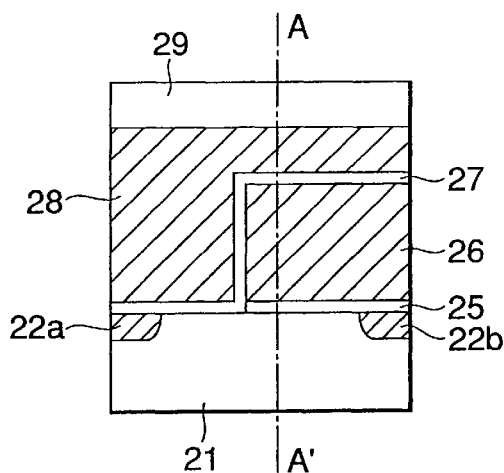
Figure 18B:
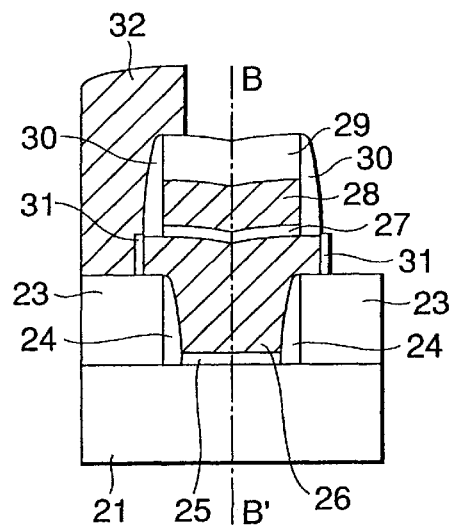
Figure 18C:
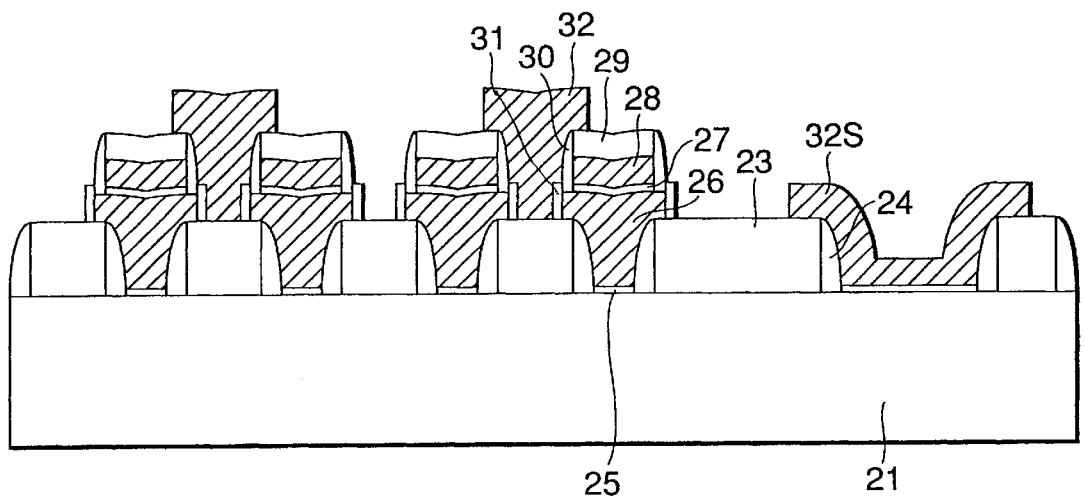

Additionally, as apparent from the comparison between FIG. 8C and FIG. 18C, in the prior art structure, a large level difference occurs between the erasing gate electrode 32 and wiring pattern 32S which are formed in the same step, thus making it impossible to effect the lithography at high precision. On the other hand, in accordance with the present invention, as seen from FIG. 8C, since the element isolation region of the memory area is constructed of the trench formed in the semiconductor substrate, the erasing gate electrode has a structure lowered by the thickness of element isolation as compared with the prior art structure. Therefore, the level difference can be decreased so that the lithography can be effected at high precision. Thus, a non-volatile memory can be fabricated with high precision and high reliability.

In the above-described embodiment, as a technique for embedding the silicon oxide film 3 for element isolation, an etch-back technique using a photoresist was used. However, it is needless to say that a CMP (chemical mechanical polishing) technique can be used to provide the same effect.

Figure 9A:
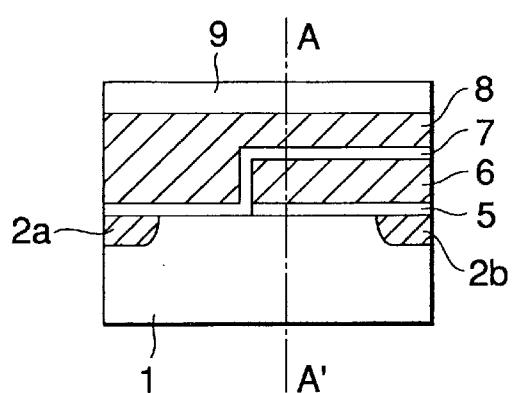
FIGS. 9A and 9B are sectional views of a semiconductor memory device for explaining the modified first embodiment of the present invention.
Figure 9B:
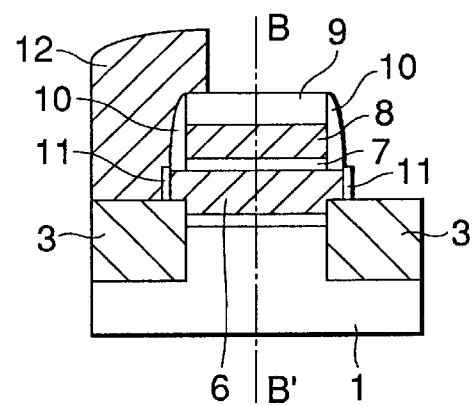

Further, in the above-described embodiment, the silicon oxide film 3 for element isolation was embedded completely in the Si substrate 1. However, it is needless to say that the structure in which the silicon oxide film 3 is partially embedded as shown in FIGS. 9A and 9B can provide the same effect. Further, the element isolation film, which was a silicon oxide film in the above-described embodiment, may be any other film as long as it permits electric insulation. For example, the isolation structure constituted by a trench formed in a silicon substrate, an oxide film formed by oxidation of the inner surface of the trench, and poly-Si embedded within the trench can provide the same effect.

Embodiment 2

Referring to FIGS. 10A–12B, an explanation will be given of the second embodiment of the present invention.

Figure 10A:
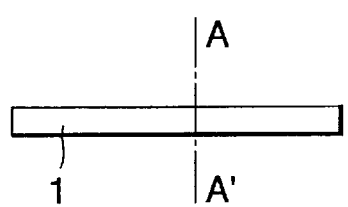
Figure 10B:
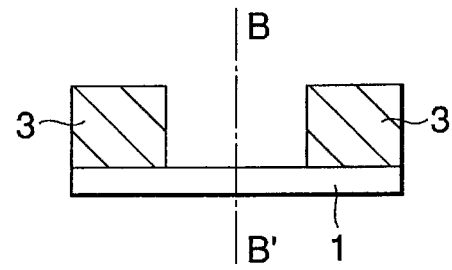

As shown in FIGS. 10A and 10B, by the known CVD technique, an silicon oxide film 3 for element isolation is formed on a Si substrate 1. Subsequently, by the selective dry etching, with a prescribed portion thereof being left, the remaining portion is removed.

Figure 11A:
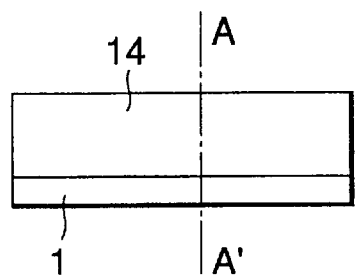
Figure 11B:
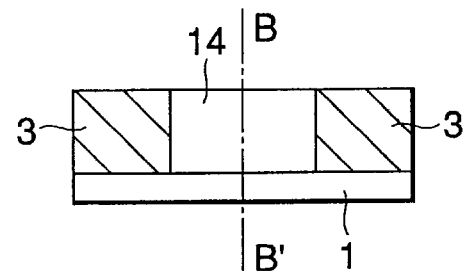

As shown in FIG. 11B, a epitaxial layer 14 having a thickness of about 300 nm is grown selectively on an region of the Si substrate 1 exposed from the silicon oxide film 3.

Figure 12A:
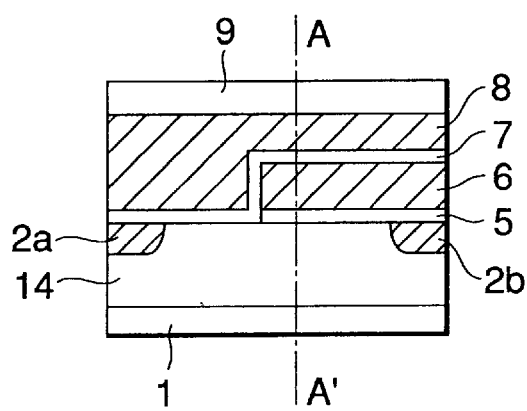
Figure 12B:
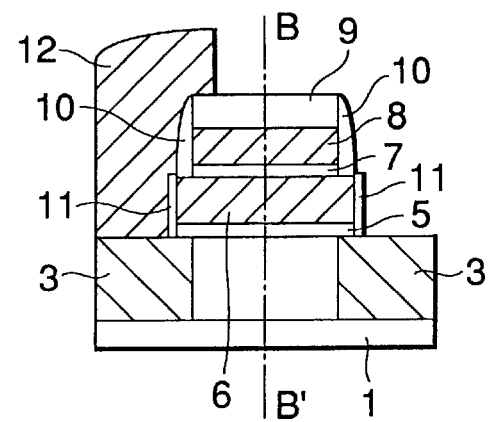
Figure 13A:
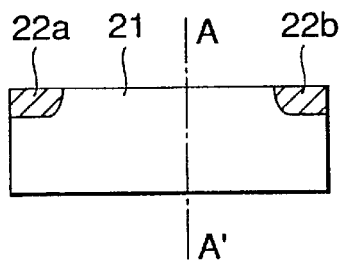
Figure 13B:
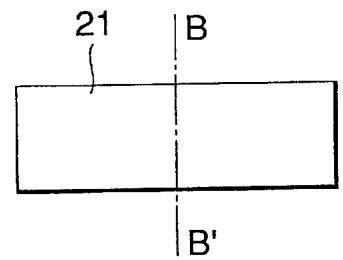
Figure 14A:
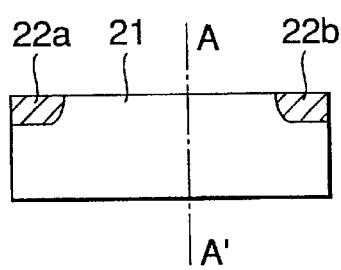
Figure 14B:
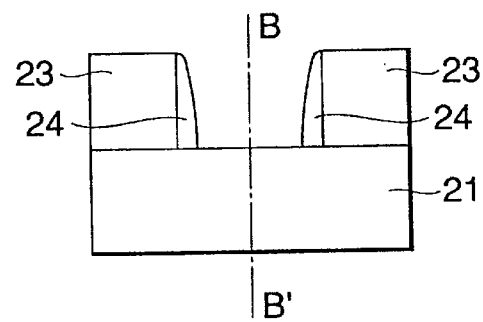
Figure 15A:
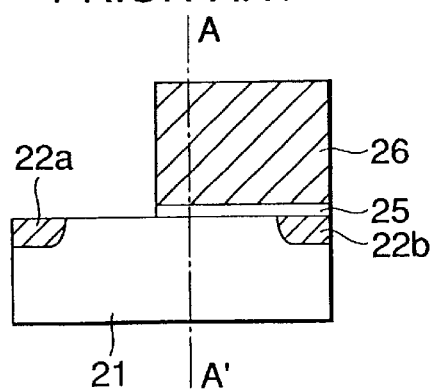
Figure 15B:
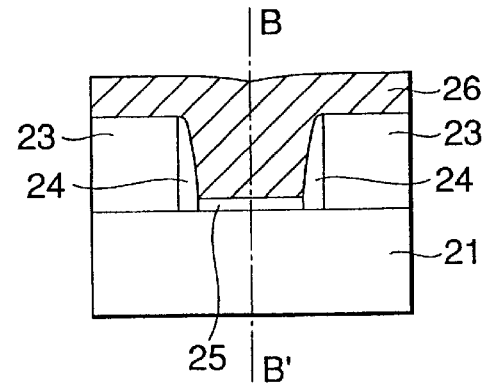
Figure 16A:
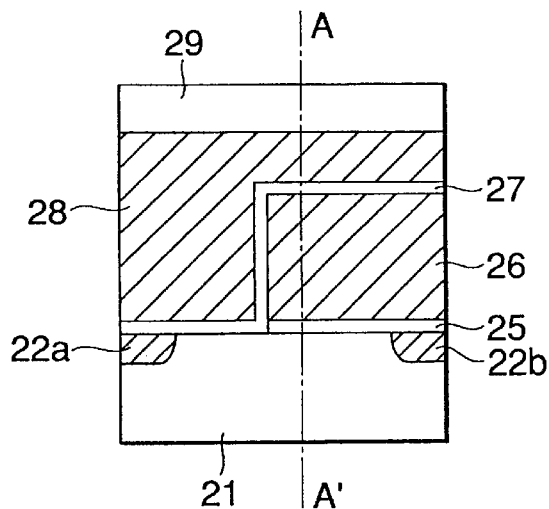
Figure 16B:
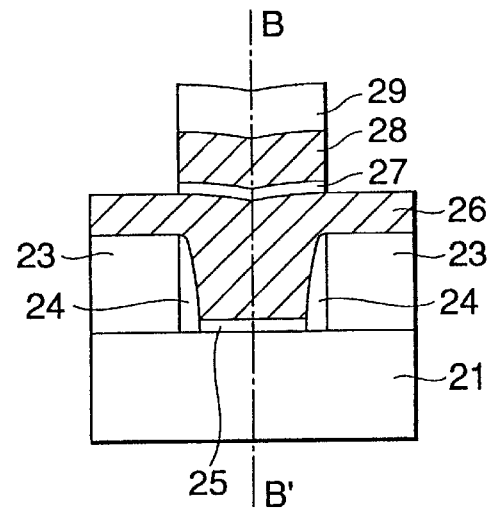
Figure 17A:
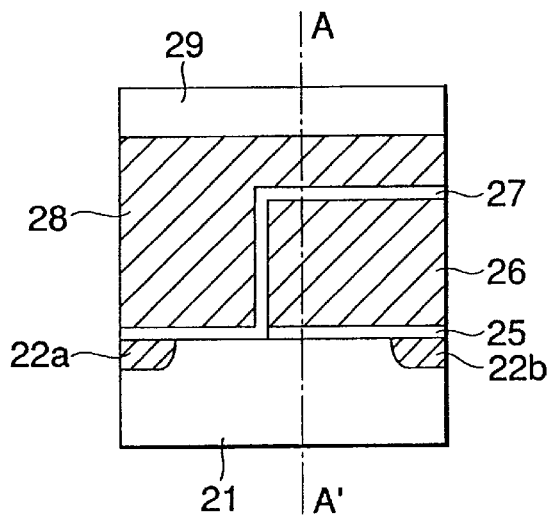
Figure 17B:
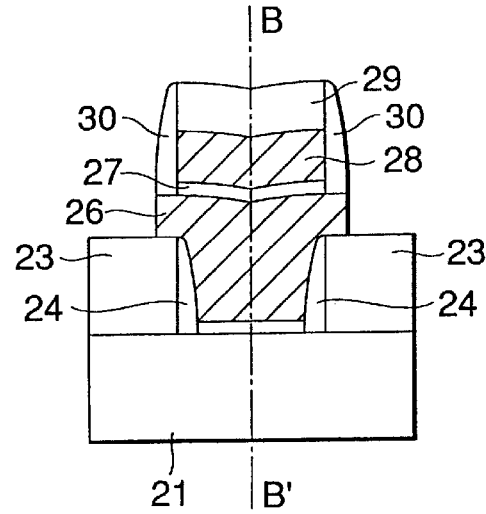

Thereafter, like the first embodiment, in the epitaxial layer 14 are formed a source 2a, drain 2b, and on the epitaxial layer 14 are formed silicon oxide film 5, phosphorus-doped poly-Si film 6 serving as a floating gate electrode, silicon oxide film 7, phosphorus-doped poly-Si film 8 serving as a control gate electrode, silicon oxide film 9, silicon oxide film 10 serving as a side wall film, silicon oxide film 11 serving as a tunneling oxide film and phosphorus doped poly-Si film 12 serving as an erasing gate electrode. Thus, as shown in FIGS. 12A and 12B, a floating gate type EEPROM equipped with an erasing gate electrode will be completed.

This embodiment has an advantage of requiring a small number of steps for element isolation than in the first embodiment.

In both first and second embodiments, an explanation was given of the structure and fabricating method of the memory cell of the split-gate floating gate type EEPROM. However, it is needless to say that the same effect can be obtained for the memory cell of a stack-gate floating gate type EEPROM.

What is claimed is:

1. A method for fabricating a semiconductor memory device comprising the steps of:

forming a source region and a drain region in a semiconductor substrate;

etching an area to be an element isolation region of said semiconductor substrate so as to form a trench, with a remainder of said substrate defining an element forming area containing the source and drain regions;

embedding an insulating film in said trench to form an element isolation region which has a surface generally equal to, or a little higher than, a surface of said element forming area of the semiconductor substrate;

forming a first insulating film on at least said element forming area of said semiconductor substrate isolated by said element isolation region;

forming a floating gate electrode having a uniform thickness on said first insulating film and overlying a part of the element isolation region;

forming a second insulating film on said floating gate electrode;

forming a control gate electrode on said second insulating film;

forming a third insulating film to be a tunneling insulating film on a side of said floating gate electrode; and forming an erasing gate electrode on the element isolation region and simultaneously forming wiring for a peripheral circuit, said wiring being made from a same material as the erasing gate electrode, said erasing gate electrode covering said third insulating film, a bottom of the erasing gate electrode being located on a level same as the surface of said element forming area of the semiconductor substrate surface.

2. The method for fabricating a semiconductor memory device according to claim 1, wherein said third insulating film is formed on a side and a portion of an upper surface of said floating gate electrode.

3. The method for fabricating a semiconductor memory device according to claim 1, wherein said element isolation region in said trench is formed by an etch-back technique.

4. The method for fabricating a semiconductor memory device according to claim 1, wherein said element isolation region in said trench is formed by a chemical mechanical polishing technique.

5. The method for fabricating a semiconductor memory device according to claim 1, wherein the steps of forming said source region and drain region, forming said trench and embedding said element isolation region in said trench are successively carried out.

6. The method for fabricating a semiconductor memory device according to claim 1, wherein the step of forming said source region and drain region is executed after the steps of forming said trench and embedding said element isolation region in said trench.

7. A method for fabricating a semiconductor memory device according to claim 1, wherein a pattern width of the first insulating film is formed to be wider than that of the second insulating film.

8. A method for fabricating a semiconductor device comprising the steps of:

forming a first insulating film to be an element isolation film on a semiconductor substrate;

etching said first insulating film so as to remove a portion thereof and expose a portion of the substrate, a remaining portion of said first insulating film forming the element isolation film;

forming an epitaxial layer by a selective epitaxy method on a surface of the semiconductor substrate that was exposed by said step of etching such that said epitaxial layer has a surface at a level generally equal to a level of the element isolation film;

forming a source region and a drain region in said epitaxial layer;

forming a second insulating film at least on said epitaxial layer;

forming a floating gate electrode on said second insulating film;

forming a third insulating film on a portion of said floating gate electrode;

forming a control gate electrode on said third insulating film;

forming a fourth insulating film to be a tunneling insulation film on a side of said floating gate electrode; and forming an erasing gate electrode so as to cover said fourth insulating film.

9. The method for fabricating a semiconductor memory device according to claim 8, wherein in the step of forming the fourth insulating film, it is formed on a side and a portion of an upper surface of said floating gate electrode.

* * * * *